United States Patent [19]

Le Can et al.

[11] 4,005,453
[45] Jan. 25, 1977

[54] SEMICONDUCTOR DEVICE WITH ISOLATED CIRCUIT ELEMENTS AND METHOD OF MAKING

[75] Inventors: Claude Jan Principe Frederic Le Can, Nijmegen; Else Kooi, Eindhoven; Walter Steinmaier, Nijmegen, all of Netherlands

[73] Assignee: U.S. Philips Corporation, New York, N.Y.

[22] Filed: Jan. 9, 1975

[21] Appl. No.: 539,634

Related U.S. Application Data

[60] Continuation of Ser. No. 399,860, Sept. 24, 1973, Pat. No. 3,909,318, which is a division of Ser. No. 237,460, March 23, 1972, abandoned.

[30] Foreign Application Priority Data

Apr. 14, 1971  Netherlands ............... 7105000

[52] U.S. Cl. .................... 357/49; 357/50; 357/52; 357/55; 357/89
[51] Int. Cl.$^2$ ............. H01L 27/12; H01L 27/04; H01L 29/34; H01L 29/06
[58] Field of Search ............ 357/49, 50, 52, 55, 357/89

[56] References Cited

UNITED STATES PATENTS

3,961,356   6/1976   Kooi ..................... 357/49

*Primary Examiner*—Edward J. Wojciechowicz
*Attorney, Agent, or Firm*—Frank R. Trifari; Jack Oisher

[57] ABSTRACT

A semiconductor device having a region of a first conductivity type, a semiconductor layer present thereon, a buried layer of the second conductivity type provided locally between the said layer and the region, a buried layer of the first conductivity type provided on said buried layer and an inset pattern of an insulating material which adjoins the buried layer of the second conductivity type and surrounds two islands of the semiconductor layer connected by the buried layer of the first conductivity type in one of which a semiconductor circuit element is provided which is contacted via the other island. Suited in particular for integration of insulated complementary transistor pairs.

6 Claims, 12 Drawing Figures

SEMICONDUCTOR DEVICE WITH ISOLATED CIRCUIT ELEMENTS AND METHOD OF MAKING

This application is a continuation of application Ser. No. 399,860 filed Sept. 24, 1973 and now U.S. Pat. No. 3,909,318 which in turn is a division of application Ser. No. 237,460, filed Mar. 23, 1972, now abandoned.

The invention relates to a semiconductor device comprising a semiconductor body having a region of a first conductivity type, a semiconductor layer present on said region and adjoining the surface of the body, at least a first buried layer of the second conductivity type present locally between said semiconductor layer and the region of the first conductivity type, and a pattern of an insulating material inset at least partly in the semiconductor layer, a region of the semiconductor layer being separated from the region of the first conductivity type and from the remaining part of the layer by the first buried layer and by a part of the pattern adjoining the first buried layer and substantially entirely surrounding said region, a semiconductor circuit element being provided at least partly in said region of the semiconductor layer.

The invention furthermore relates to a method of manufacturing the device.

The said semiconductor layer may be a single layer but may also be a composite layer consisting for example of two or more epitaxial layers present one on the other, while various parts of the layer may show different conductivity types and/or conductivities, for example by in-diffusing donors of acceptors.

Devices of the type described are known and are used in particular in monolithic integrated circuits. Said structures have various important advantages of which is to be mentioned first of all a considerable space saving so that in integrated circuits a very great packing density of circuit elements can be achieved. This space saving is achieved in particular in that one or more p-n-junctions belonging to a circuit element can be arranged immediately against the inset insulating material and need not, as in conventional integrated circuits, be kept spaced at a certain distance from diffused insulation zones.

A further important advantage of the said structures having an inset pattern of an insulating material is that, also as a result of the methods used for providing said pattern, the masking processes necessary for carrying out the various diffusions can be considerably simplified.

Furthermore, for the manufacture of the described structures having an inset insulating pattern, fewer alignment steps are generally necessary, while the tolerance per alignment step is in most of the cases comparatively large, all this as a result of the fact that the pattern of insulating material can be used entirely or partly as a diffusion mask also.

The device as described above provides the possibility of arranging a circuit element in a monolithic integrated circuit in such manner that said element is insulated by the inset pattern of insulating material and by the p-n junction between the said first buried layer and the region of the first conductivity type, from the remaining parts of the semiconductor layer and from said region. In this device the first buried layer itself usually forms an active zone of the semiconductor circuit element.

However, the structure described is less suitable for a number of important applications in integrated semiconductor circuits. This applies inter alia to many cases in which the said region of the first conductivity type, usually constituted by the substrate, is to be used as an active zone in the circuit, for example, as a collector zone of one or more bipolar transistors of the same conductivity structure, for example n-p-n, as an adjacent n-p-n transistor insulated from the substrate and provided according to the described known structure.

Another frequently occurring structure for which the use of the known device is less suitable is, for example, a structure in which semiconductor circuit elements, for example, bipolar transistors, of complementary structure (n-p-n and p-n-p) must be present in the same semiconductor body side by side, both transistors being isolated from the substrate and having comparable electric properties.

Semiconductor circuit elements having a complementary structure are to be understood to mean here and hereinafter two similar semiconductor circuit elements of which each semiconductor zone of the first element has a conductivity type which is opposite to that of the corresponding zone of the second element, for example, an n-p-n and a p-n-p bipolar or field effect transistor.

One of the objects of the invention is to provide a semiconductor device having an inset pattern of electrically insulating material of a new structure, which does not show the said restrictions of the described known structures or shows said restrictions at least to a considerably smaller extent and which can be manufactured with a minimum of masking steps and a large tolerance in the alignment of the masks. Another object of the invention is to provide a new, very simple method of manufacturing such a device.

For that purpose, the invention is inter alia based on the recognition of the fact that by using a second buried layer of the first conductivity type in combination with a configuration of the inset insulating pattern such that said second buried layer is at most only partly traversed by the inset pattern, a structure can be obtained having very important technological and electrical advantages as compared with known devices.

Therefore, according to the invention, a device of the type mentioned in the preamble is characterized in that between the first buried layer and the semiconductor layer a second buried layer of the first conductivity type is present and that the said region of the semiconductor layer is divided, by a part of the inset pattern of insulating material which is separated from the first buried layer by at least a part of the thickness of the second buried layer, into at least a first island-shaped region in which the semiconductor circuit element is provided at least partly, and a second island-shaped region of the first conductivity type, which regions both adjoin the second buried layer.

In addition to the advantages already described which are associated with the use of an inset pattern of insulating material in general, the device according to the invention has inter alia the important advantage that the said circuit element which within the semiconductor body is isolated from the region of the first conductivity type and from the remaining part of the circuit by the first buried layer, can be combined, if desirable, with one or more circuit elements of the same type and conductivity structure of which the said region of the first conductivity type constitutes a (common) active zone. Another important advantage is that the device according to the invention is very suitable to be combined with a structure which comprises another circuit element which is of a structure which is complementary to the first-mentioned circuit element and is likewise insulated from the region of the first conductivity type, corresponding active zones of said complementary circuit elements being of opposite conductivity types but showing comparable doping concentrations.

The insulating material of the inset pattern may consist of a variety of materials or of combinations of layers of different insulating materials. However, the inset pattern of insulating material advantageously consists of oxide obtained by local oxidation, for example thermal oxidation, of the semiconductor material. In this case, the pattern preferably extends everywhere from the surface down to substantially the same depth in the semiconductor material. Such a pattern has the advantage that it can be manufactured in a simple manner and, if desirable, in one oxidation step and while using one mask.

Furthermore, the said semiconductor circuit element preferably comprises at least one p-n junction having a part which extends substantially parallel to the surface and which is bounded by the inset pattern of the insulating material. As a result of this a reduction of the number of masking steps can be obtained during the manufacture of the device, while also in certain alignment steps a large tolerance is admissible, namely in those cases in which the inset pattern is used at least partly as a diffusion mask.

The second buried layer of the first conductivity type can extend within the inset pattern over only a part of the buried layer, as a result of which parts of the said semiconductor layer contact the first buried layer. However, in order to obtain between the semiconductor circuit element and the remaining part of the semiconductor body an insulation which as efficient as possible, it is recommended to use a structure wherein the semiconductor layer is entirely separated from the first buried layer by the second buried layer. As a result of this, two p-n junctions, of which in practice always at least one will be biased in the reverse direction and produce the isolation desired, are present between the seimconductor circuit element and the region of the first conductivity type.

The region of the first conductivity type may consist of a homogeneously doped semiconductor substrate of the first conductivity type on which and/or in which the said semiconductor layer is provided. However, according to a preferred embodiment which can be manufactured in a simple and efficient manner, the device is constructed so that the region of the first conductivity type comprises a highly doped substrate of the first conductivity type and an epitaxial layer of the first conductivity type provided on said substrate, in which layer the first buried layer is present at least mainly. In this case the highly doped substrate may serve as a low-ohmic contact zone on the lower doped epitaxial layer of the first conductivity type.

During the manufacture, the semiconductor layer present on the region of the first conductivity type is generally provided in the form of a layer which is entirely of the first or of the second conductivity type, but in the completed device parts of said layer have been converted, for example by diffusion or by ion implantation, into the conductivity type which is opposite to that of the original layer. According to an important embodiment the said first island-shaped region comprises a zone of the second conductivity type which adjoins the surface and which is either a part of an original semiconductor layer which is entirely of the second conductivity type, or is constituted by overdoping of a part of the semiconductor layer which originally was of the first conductivity type.

In certain circumstances, the said zone of the second conductivity type may form one assembly with the first buried layer. In general, however, this is undesirable, inter alis, to obtain a good isolation and none too large p-n junction capacities, and it will be preferred that the zone of the second conductivity type adjoining the surface is separated entirely from the first buried layer by material of the first conductivity type.

An important preferred embodiment is characterized in that the zone of the second conductivity type which adjoins the surface constitutes the base zone of a bipolar transistor, the emitter and collector zones of which are constituted by the second buried layer and by at least a surface zone of the first conductivity type provided in the base zone.

The doping concentration of the zones of the second conductivity type adjoining the surface may be substantialy homogeneous, for example, when said zone forms a part of an originally provided homogeneously doped semiconductor layer of the second conductivity type. Often, for example when the buried layer of the second conductivity type is used as a collector zone, it will be advantageous when the doping concentration of the zone of the second conductivity type adjoining the surface decreases from the surface in the direction of the second buried layer, while, for example in the reverse case, when the second buried layer is used as an emitter zone, the doping concentration of said zone will preferably decrease from the second buried layer to the surface so as to obtain in the base zone a doping profile which is as favourable as possible. These doping profiles can be obtained, for example, by means of diffusion steps.

The said surface zone of the first conductivity type belonging to the bipolar transistor may adjoin the inset pattern of insulating material, if desirable, in which case a large tolerance is permitted in the alignment step necessary for the manufacture of the said surface zone.

In all the above embodiments the second island-shaped region of the first conductivity type may advantageously be used to contact the circuit element in the first island-shaped region via the second buried layer of the first conductivity type. For that purpose, the doping concentration of the second island-shaped region is preferably made higher in a part adjoining the surface than in the underlying part so as to be able to provide a good contact on the surface. This can be done in known manner, for example, by providing a highly doped surface zone of the first conductivity type in the second island-shaped region or by performing in said islands a diffusion of the first conductivity type throughout the thickness of the semiconductor layer.

The semiconductor body advantageously consists entirely of silicon and the inset pattern consists at least partly of silicon oxide. For many applications in which the inset pattern is in general obtained by local thermal oxidation of silicon, this construction of the device is most advantageous.

The device according to the invention is of particular importance in that it can be combined with other structure in a very suitable manner. A combination by which semiconductor circuit elements of complementary structures can be provided in a very simple manner in the same monolithic circuit is of particular practical interest. In connection herewith, a very important preferred embodiment according to the invention is characterized in that a third buried layer of the second conductivity type is present beside the first buried layer between the region of the first conductivity type and the semiconductor layer, a further part of the semiconductor layer being separated substantially entirely from the region of the first conductivity type and from the remaining part of the semiconductor layer by the third buried layer and by a part of the inset pattern of insulating material adjoining the third buried layer and the further part, said further part comprising at least an island-shaped region bounded by the third buried layer and the inset pattern in which region a semiconductor circuit element of a structure which is complementary to the said circuit element provided in the first island-shaped region is at least partly provided.

The first and the third buried layer will preferably be separated from each other, but in certain circumstances they may cohere together.

Although this is not necessary, a structure of the inset pattern of insulating material will preferably be chosen such that the inset pattern part which bounds the said further part forms part of the inset pattern part which bounds the first and the second island-shaped region. As a result of this very compact structure of the device is obtained at the same time.

Furthermore, such a structure is preferably constructed so that the further part of the semiconductor layer is divided by a part of the inset pattern which adjoins the third buried layer and extends at most over a part of the thickness of the buried layer, into a third island-shaped region in which the semiconductor element of a complementary structure is provided at least partly and a fourth island-shaped region of the second conductivity type. The fourth island-shaped region may serve to contact the said complementary circuit element via the third buried layer.

The complementary semiconductor circuit elements may consist, for example, of p-n junction field effect transistors (junction FET) or insulated gate field effect transistors (IGFET). Other elements, for example, p-n-p-n structures, are also to be considered. Of particular importance, however, is the frequency occurring case in which the complementary semiconductor circuit elements are constituted by complementary bipolar transistors. Therefore, a further important preferred embodiment is characterized in that the third island-shaped region comprises a zone of the first conductivity type which adjoins the surface and in which at least a surface zone of the second conductivity type is provided, the zone of the first conductivity type constituting the base zone of a bipolar transistor, the emitter and collector zones of which are constituted by the third buried layer and the said surface zone of the second conductivity type.

In many cases it will prove to be not necessary to contact the buried layers of the second conductivity type, and said buried layers can be maintained at a floating potential. In certain circumstances, however, it may be of advantage to provide the first and/or the third buried layer with a connection conductor. This may prove necessary in particular in those cases in which the first and/or the third buried layer constitutes an active zone of the semiconductor circuit element.

The device according to the invention can furthermore be combined with particular advantage with one or more elements, for example, bipolar or field effect transistors of the circuit arrangement the substrate region of which of the first conductivity type constitutes a (common) active zone. According to another important embodiment the device is therefore constructed so that the inset pattern of insulating material also bounds at least one island-shaped region of the semiconductor layer adjoining the surface, said region comprising at least a zone of the second conductivity type adjoining the surface, which zone is bounded by the inset pattern and by material of the first conductivity type which adjoins the region of the first conductivity type, the said one of the second conductivity type and the underlying region of the first conductivity type both constituting active zones of a semiconductor circuit element.

In the manufacture of this preferred embodiment the important advantage occurs that simultaneously with the provision of the at least partly inset pattern of insulating material in one and the same process step at least a part of the diffusion mask required for the manufacture of the semiconductor circuit elements with common zone if formed. When said elements are vertical bipolar transistors, only the parts of the layer masking against oxidation and present at the area need be removed for the base diffusion of said transistors, which requires only one alignment step of a small accuracy.

In order to obtain a structure which is as compact as possible, it is usually preferred that the inset pattern part which bounds the island-shaped region of the semiconductor layer adjoining the region of the first conductivity type forms part of the inset pattern part which bounds the island-shaped regions of the semiconductor layer present above the first or the third buried layer. An even more compact structure can be obtained when the inset pattern of insulating material comprises a coherent network which bounds a number of islands of the semiconductor layer adjoining the region of the first conductivity type, in which islands are provided semiconductor circuit elements having a common zone comprising the underlying region of the first conductivity type.

The invention also relates to a very efficacious method of manufacturing the device described. This method is characterized in that a first buried layer of the second conductivity type is locally provided on or in a region of the first conductivity type, that a second buried layer of the first conductivity type which is fully surrounded by a part of the first buried layer is provided on and in contact with said first buried layer, that a semiconductor layer is provided by epitaxial growing on and in contact with the region of the first conductivity type and the buried layers, and that the semiconductor layer is exidized over at least a part of its thickness by a local oxidation treatment while using a layer masking against oxidation, the oxidation process being continued until the resulting oxide pattern extends up to the part of the first buried layer surrounding the second buried layer, and at most only over a part of the thickness of the second buried layer, so that a first and a second island-shaped region of the semiconductor layer are formed, zones of a semiconductor circuit element being then provided in the first island-shaped region.

This method can advantageously be carried out so that the starting material is a highly doped substrate of the first conductivity type and an epitaxial layer of the first conductivity type which is provided thereon and has a lower doping concentration than the substrate, and that the first buried layer is provided at least mainly in and preferably throughout the thickness of the said epitaxial layer of the first conductivity type.

An optimum isolation is obtained when a second buried layer of the first conductivity type is provided the edge of which is so close to the edge of the first buried layer that the part of the inset oxide pattern formed during the oxidation process and adjoining the part of the first buried layer surrounding the second buried layer at the same time adjoins the second buried layer.

In order to obtain a surface which is as flat as possible, which is desirable in particular for providing the metallisation, at least one of the parts of the semiconductor layer not covered by the masking layer is etched prior to carrying out the oxidation treatment. This etching is generally carried out down to such a depth that an inset oxide pattern is formed by the oxidation of said etched part, of which pattern the surface is substantially at the level of the original surface of the semiconductor layer since the formed oxide occupies a larger volume than the oxidized semiconductor material had.

A very important preferred embodiment of the method is characterized in that simultaneously with the first buried layer a third buried layer of the second conductivity type is provided which is present beside the first buried layer, that a third and a fourth island-shaped region of the semiconductor layer are formed at the same time by local oxidation and are connected together via the third buried layer, the fourth island-shaped region obtaining the second conductivity type by the introduction of activators during or after the provision of the semiconductor layer, zones of a semiconductor circuit element preferably of a structure which is complementary to the circuit element provided in the first island-shaped region being provided in the third island-shaped region. As a result of this, complementary circuit elements in particular bipolar transistors which are isolated from each other and from the substrate region can be formed in the same monolithic circuit.

A further important variation of the method according to the invention is obtained, when one or more island-shaped regions of the semiconductor layer adjoining the underlying region of the first conductivity type are formed at the same time by local oxidation, in which regions semiconductor circuit elements are provided having at least a zone of the second conductivity type which adjoins the surface and is bounded by the inset oxide. This preferred method is preferably carried out so that the inset oxide pattern which bounds the island-shaped regions of the semiconductor layer adjoining the underlying region of the first conductivity type is provided in the form of a network coherent with the remaining part of the oxide pattern. As a result of this, for example, one or more bipolar transistors having a common collector zone can be formed with a minimum of masking and alignment steps beside and simultaneously with an isolated bipolar transistor or a pair of complementary isolated transistors. Such a group of transistors formed by means of an inset pattern of insulating material and having a common zone, combined or not combined with a fully isolated structure while using this inset pattern, in itself is an electrically and technologically intersecting part of a monolithic circuit.

In order that the invention may be readily carried into effect, a few examples thereof will now be described in greater detail, by way of example, with reference to the accompanying drawings, in which.

Figure 1:
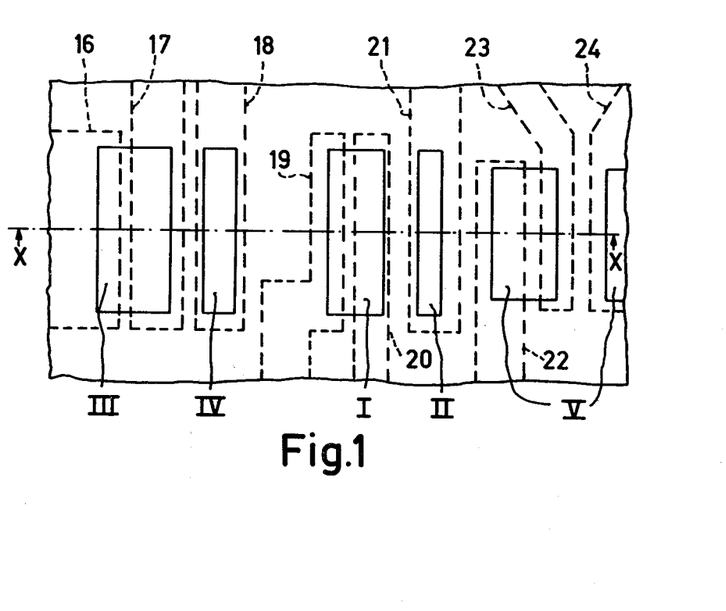
FIG. 1 is a diagrammatic plan view of a part of a device according to the invention.

The figures are diagrammatic and not drawn to scale, Corresponding parts are generally referred to by the same reference numerals. In the cross-sectional views semiconductor zones shown with the same direction of hatching, generally have the same conductivity type. In FIG. 1, the boundaries of metal layers are shown in broken lines and the boundaries of the inset oxide pattern are shown in solid lines.

Figure 2:
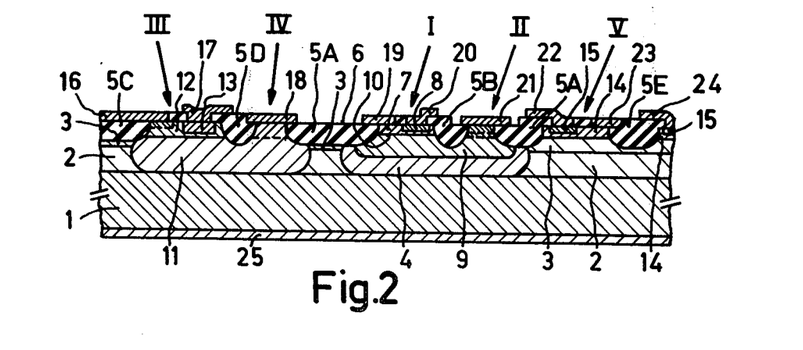
FIG. 2 is a diagrammatic cross-sectional view of the device shown in FIG. 1 taken on the line X—X of FIG. 1, FIGS. 3 to 10 are diagrammatic cross-sectional views taken on the line X—X of FIG. 1 of the device shown in FIGS. 1 and 2 in successive stages of manufacture.

FIG. 1 is a plan view and FIG. 2 a diagrammatic cross-sectional view taken on the line X—X of FIG. 1 of a part of a semiconductor device according to the invention. The device constitutes a monolithic integrated circuit and comprises a monocrystalline n-type region (1,2) consisting of a highly doped support 1 of n-type silicon, having a resistivity of 0.01 ohm. cm, and an epitaxial layer 2, likewise of n-type silicon and provided on said support, having a thickness of 8 microns and a resistivity of 0.6 ohm. cm. On the n-type region (1,2) is located a monocrystalline n-type silicon layer 3 having a thickness of 3 microns and a resistivity of 0.3 ohm. cm, in which a number of zones of different conductivity types are provided of which zones the function will be described hereinafter.

Between said semiconductor layer 3 and the region (1,2) is located locally a first buried layer 4 of p-type conductivity. This layer 4 is mainly present in the epitaxial layer 2.

Furthermore, a pattern of an insulating material inset in the semiconductor layer 3 is present and in this example consists of inset regions 5 of silicon oxide, which extend from the surface 6 everywhere down to substantially the same depth in the semiconductor body.

A region of the semiconductor layer 3 is separated from the n-type region (1,2) and from the remaining part of the layer 3 by the first buried layer 4 and by the part 5A of the oxide pattern 5 adjoining the buried layer 4 and fully surrounding said region. Provided in this region is a bipolar n-p-n transistor having a p-type base zone 7 adjoining the surface 6 in which zone is provided an n-type surface zone 8, the emitter zone.

According to the invention, an n-type conductive second buried layer 9 is present between the first buried layer 4 and the semiconductor layer 3, and the region of the semiconductor layer 3 surrounded by the buried layer 4 and the oxide 5A is divided, by a part 5B of the oxide pattern, into a first island-shaped region I and a second n-type island-shaped region II which both adjoin the second buried layer 9. The oxide part 5B is separated from the first buried layer 4 by a part of the thickness of the second buried layer 9. The first island-shaped region I comprises the already mentioned p-type base zone 7 and the n-type emitter zone 8 of the bipolar n-p-n transistor, the collector of which is formed by the n-type buried layer 9 which can be contacted via the n-type island II at the surface 6. The base-collector junction 10 of the transistor extends parallel to the surface 6 and is bounded by the inset oxide pattern 5. The semiconductor layer 3 in the example is separated entirely from the first buried layer 4 by the second buried layer 9.

The device described thus far can be manufactured not only in a particularly simple manner as will be described hereinafter, but at the same time presents the important advantage that it can be combined in a very suitable manner in a monolithic integrated circuit with other semiconductor circuit elements.

For instance, in the example described here (see FIG. 2), a third p-type conductive buried layer 11 is provided beside the first buried layer 4. A further part of the semiconductor layer 3 present between said third buried layer 11 and the surface 6 is separated entirely from the n-type region (1,2) and from the remaining part of the layer 3 by the third buried layer 11 and by a part of the oxide pattern 5 which fully surrounds said further part, is constituted by the parts 5A and 5C (see FIG. 1 and 2) and adjoins the layer 11.

The said further part of the layer 3 comprises an n-type base zone 12 and a p-type emitter zone 13 of a bipolar p-n-p transistor the collector zone of which is formed by the buried layer 11. The said further part of the layer 3 is divided into a third island-shaped region III and a fourth island-shaped region IV by a part 5D of the inset oxide pattern which adjoins the buried layer 11 and extends only over a part of the thickness of said buried layer. The third island-shaped region III is fully occupied by the n-type base zone 12 and the p-type emitter zone 13, via the fourth island-shaped region IV which is fully p-type conductive, the buried layer 11 serving as a collector zone can be contacted.

According to the structure described, two bipolar transistors of complementary structure which are isolated both from each other and from the substrate region (1,2) have been constructed in a compact structure in the same semiconductor plate, in which the current direction from emitter to collector is transverse to the surface 6 for both transistors, in contrast with, for example, known combinations of complementary transistors which are formed by an isolated vertical transistor and a lateral transistor the substrate region of which forms the base zone. In the combination according to the invention both transistors have the same structure and corresponding zones can moreover by given mutually comparable doping concentrations in contrast with many known structures with complementary transistors (or other semiconductor circuit elements).

Furthermore, in the device described a number of transistors are present having a common collector zone of which in the drawing one transistor is shown fully and another is shown partly. The inset oxide pattern comprises for that purpose a network of inset oxide regions 5E which surround a number of island-shaped regions V of the silicon layer 3 which adjoin the n-type region (1,2). These island-shaped regions each comprise a p-type zone 14 which adjoins the surface 6 and in which an n-type surface zone 15 is provided. The zones 14 are bounded by the inset oxide and constitute the base zones of transistors of which the zones 15 are the emitter zones while the common collector zone is formed by the n-type regions 1 and 2. The said network of inset oxide parts at the same time comprises a part 5A which is associated with the isolation of the n-p-n transistor (8, 7, 9).

The zones 12, 13, 7, 8, 14 and 15, the islands II and IV and the support of substrate 1 are contacted by metal layers 16 to 25.

It will be obvious that such a network may comprise, instead of a part 5A, a part 5C of the oxide pattern which belongs to the isolation of the p-n-p-transistor (13, 12, 11) or may also be separated entirely from the said parts 5A and 5C of the pattern. The islands bounded by the network may adjoin the n-type region (1, 2) if desirable also via an intermediate n-type buried layer, which n-type buried layer may be provided simultaneously with the layer 9. The transistors provided in the network may also be lateral transistors (with a common base zone (1,2). If desirable, said transistors may also comprise one or more lateral and one or more vertical transistors, the base zone of the lateral transistors and the collector zone of the vertical transistors in the circuit being connected together and being constituted by the n-type region (1,2).

Of course the structure described constitutes only an example of the many possibilities of the device according to the invention. In certain circumstances, for example, the layer 4 may be connected to the layer 11. Instead of a common oxide region 5A between the transistors (8, 7, 9) and 13, 12, 11) the oxide insulation may be formed by mutually separated parts of the oxide pattern.

Furthermore, the oxide regions which surround the insulating transistors (8, 7, 9) and (13, 12, 11), as well as to the buried layer 4 and 11, may show in certain circumstances an aperture or interruption through which, for example, a supply voltage can be supplied from other parts of the semiconductor body or via which a circuit element is connected to all parts of the circuit by a resistor formed by the material of the semiconductor layer.

Figure 3:
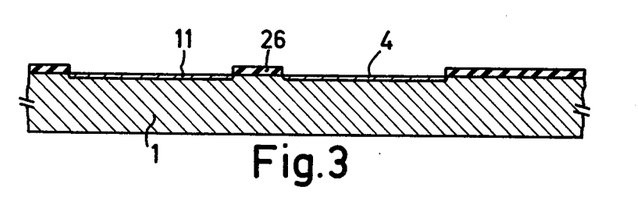

A very practical and simple method of manufacturing the above device will now be described. Starting material (see FIG. 3) is an n-type silicon plate 1 having a resistivity of 0.01 ohm. cm. A large number of identical devices can be manufactured simultaneously on said plate; the manufacture will now be described with reference to the part of one of the said devices shown in the drawings.

Figure 4:
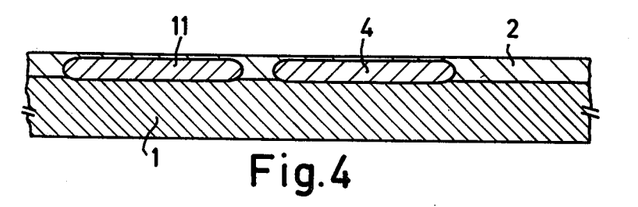

Boron is locally diffused in the surface of the plate 1, to form the p-type layers 4 and 11 while using an oxide mask 26. The layers 4 and 11 have a sheat resistance of approximately 450 ohm. per square and penetrate only slightly into the plate 1 as a result of the high doping concentration of the plate. After removing the oxide mask 26, an n-type silicon layer 2 having a resistivity of 0.6 ohm. cm and a thickness of 8 microns is provided in the usual manner on the plate 1 by epitaxial growing. During said epitaxial growing the layers 4 and 11 diffuse from the substrate 1 through nearly the whole thickness of the layer 2.

Figure 5:
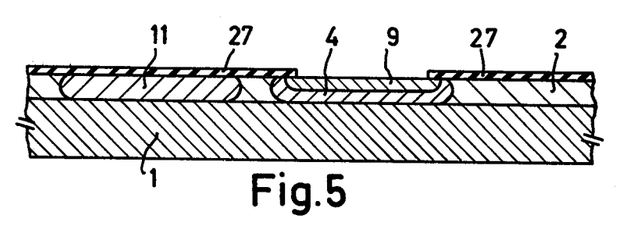

While using a new oxide mask 27 (see FIG. 5) arsenic is diffused in a part of the layer 4 to form the n-type layer 9 having a sheat resistance of 20 ohm per square in such manner that the layer 9 is fully surrounded by the layer 4.

Figure 6:
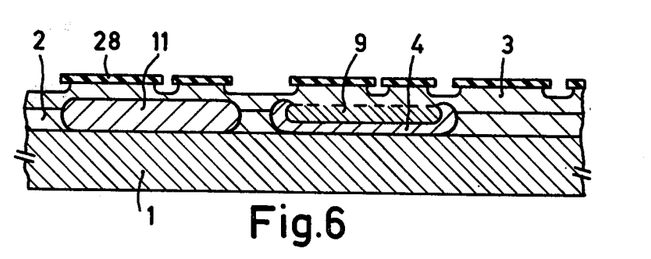

After removing the mask 27, an n-type silicon layer 3 is grown having a resistivity of 0.3 ohm. cm and a thickness of 3 microns (see FIG. 6). This layer 3 is then covered with a layer 28 masking against oxidation, for example of silicon nitride. While using known photolithigraphicetching methods, apertures are provided in said layer 28 and the silicon exposed within said apertures is partly etched away down to a depth of approximately 1 micron (see FIG. 6). For all technical details regarding the local oxidation and the photolithographic etching treatment of nitride layers masking against oxidation, reference is made to the article by Appels et al., in "Philips Research Report", April 1970, pp. 118–132.

Figure 7:
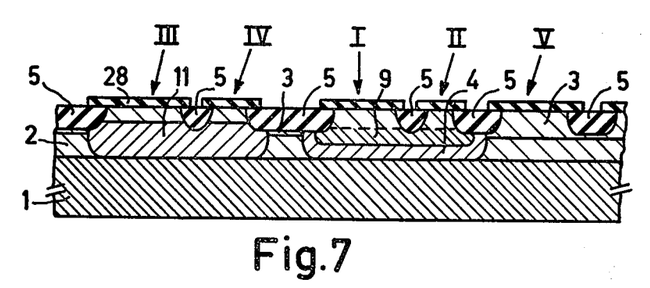

The silicon is then oxidized at 1000° C in moist oxygen, the oxidation process being continued unitl the resulting oxide pattern 5 extends up the layers 9 and 11 which during the growing of the layer 3 have diffused substantially entirely from the plate 1 in the layers 2 and 3, but only over a part of the thickness of the n-type layer 9, see FIG. 7. The upper side of the inset oxide pattern 5 substantially coincides with the upper side of the layer 3. In this way the island-shaped regions I to V of the semiconductor layer 3 are obtained.

Figure 8:
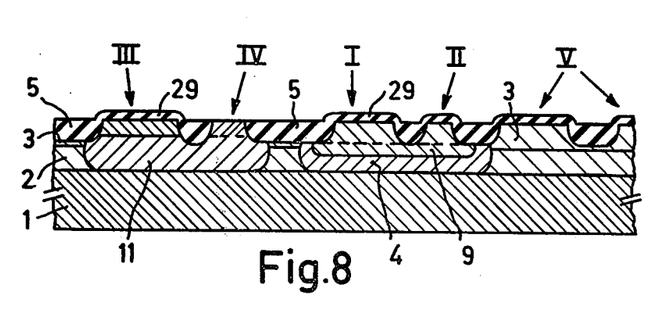
Figure 9:
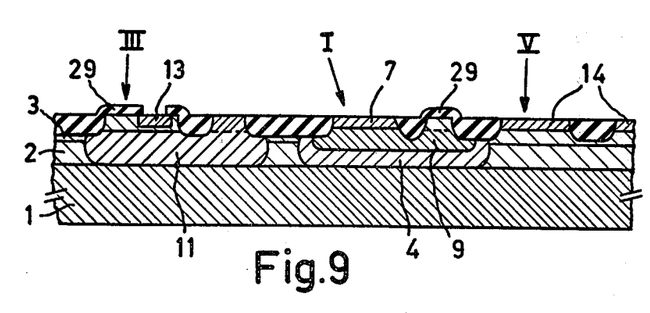

The masking layer 28 is then removed and an oxide layer 29 is provided by thermal oxidation, see FIG. 8, after which the island IV is made fully p-type conductive by a deep boron diffusion. An aperture is then etched in the masking layer 29 above the island III and above the islands I and V the layer 29 is fully removed after which the p-type zones 13, 7 and 4 are provided by a less deep boron diffusion, see FIG. 9.

Figure 10:
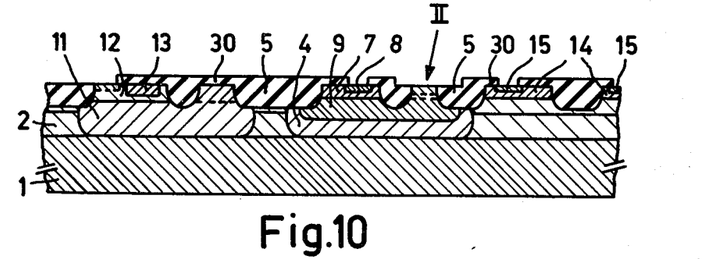

In the above-mentioned diffusion carried out after the oxidation process, alignment steps of only a small accuracy are necessary for providing the zones 7 and 14 and for doping the island IV, since the inset oxide 5 already present serves at the same time as a diffusion mask. The masking layer 29 is then removed and an oxide layer 30 is provided in known manner throughout the surface by a thermal conversion of silane (SiH$_4$) and oxygen. This may also be done by thermal oxidation. This layer is used as a diffusion mask for providing, by means of a phosphorus diffusion, the n-type zones 8 and 15 and the highly doped n-type contact regions on the base zone 12 and the islands II, see FIG. 10. After etching contact windows and vapour deposition, and photolithographic etching of the metal layers 16 to 25 (usually of aluminum), the structure shown in FIGS. 1 and 2 is obtained.

Since the p-type buried layer 4 diffuses from the support 1 throughout the thickness of the layer 2 and even over a part of the thickness of layer 3, a comparatively small depth of penetration of the oxide 5 is sufficient so that excessively long oxidation times can be avoided, which makes said isolation method by means of a combination of epitaxial growth on a buried layer and local oxidation technologically particularly interesting.

According to a variation, the structure shown in FIGS. 1 and 2 may also be obtained by growing a p-type layer 3 on the layer 2 instead of an n-type layer 3. For example, the oxide pattern 5 may be provided throughout the thickness of the layer 3, while the diffusion steps can be varied, for example, so that after the oxidation first the n-type base zone 12 and the n-type island 2 are formed after which, by a less deep n-diffusion the emitter zones 8 and 15 are formed by the provision of a new diffusion mask to form the p-type emitter zone 13 and the base contact regions on the islands IV, I and V. In this case, the base zones 7 and 14 as parts of the original p-type layer 3 may be homogeneous, while the doping concentration of the zone 12 decreases from the surface in the direction of the buried layer 1 in contrast with the above-described method in which the doping of the base zone 12 is substantially homogeneous and the doping concentration of the zones 7 and 14 decreases from the surface in the direction of the region 1.

Many other variations are possible. For example, the buried layers 4 and 9 can be diffused after each other via the same diffusion mask both in the surface of the epitaxial layer 2. According to an important embodiment, the buried layer 4 or 11 or both layers may be contacted at the surface. Such a structure is shown in the diagrammatic cross-sectional view of FIG. 11, in which, for example, the regions 31, 33, 35, 37 and 39 have n-type conductivity and the regions 32, 34, 36 and 38 have p-type conductivity. In this manner a combination of an isolated n-p-n-transistor (39, 38, 33) and an insulated n-p-n-p thyristor structure (37, 36, 35, 34) which in itself is also particularly interesting, is obtained. The n-type substrate region 31 in this example is single and comprises no epitaxial layer as in the preceding example. The metal layer parts 40, 41 and 42 constitute the emitter, base and collector electrodes of the transistor and the metal layer parts 43 and 44 constitute the cathode and the anode of the thyristor of which the metal layer 45 is the control electrode. The inset oxide pattern 46 in this example comprises deeper-inset parts 45A and less deeply-inset parts 46B. This can be achieved, for example, either by covering the semiconductor surface occupied by the part 46B by the layer masking against oxidation during a part of the oxidation time and removing said part of the masking layer only at a later instant of the oxidation treatment, or by not etching the silicon at the area of the oxide region 46B prior to the oxidation treatment, in which case a part of the region 46B will grow above the semiconductor surface. In this example an epitaxial n-layer is used on which an epitaxial p-layer is provided; the boundaries between said layers which together constitute the monocrystalline semiconductor layer mentioned in the preamble are partly shown in broken lines. The zones 35, 36 and 38 are parts of said epitaxial layers. The remaining zones are obtained at least mainly by diffusion.

Figure 11:
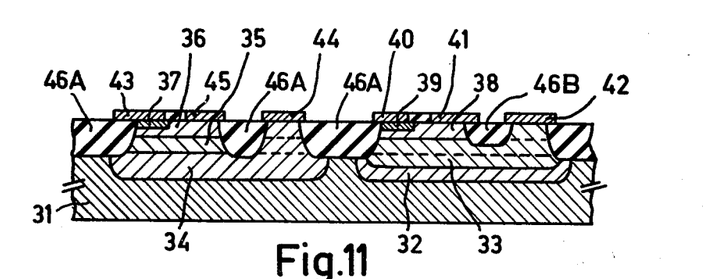
FIG. 11 is a diagrammatic cross-sectional view of another device according to the invention.

In the example shown in FIG. 11 the buried layer 34 beside the oxide region 46A is contacted. In analogy herewith, for example, in the device shown in FIG. 2 the buried layer 4 could be contacted in the same manner to obtain an n-p-n-p element (8, 7, 9, 4); in that case, the zone 8 could also be omitted and the combination of the regins 7, 9 and 4 could be used as a p-n-p transistor.

Figure 12:
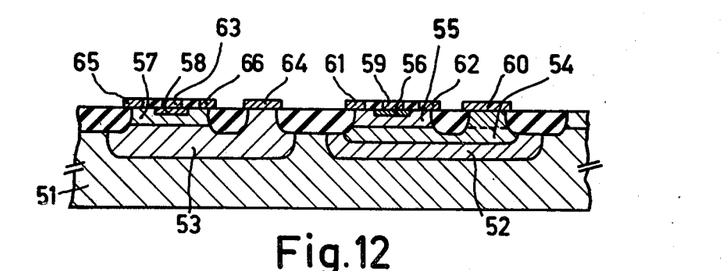
FIG. 12 is a diagrammatic cross-sectional view of a device having complementary field effect transistors according to the invention.

Another variation is shown in FIG. 12, in which a structure analogous to that shown in FIG. 2 is shown with n-type regions 51, 54, 56 and 57 and p-type regions 52, 53, 55 and 58, but in which the semiconductor circuit elements are complementary junction-field effect transistors, an n-p-n field effect transistor with gate electrodes 59 and 60, gate electrode zones 54 and 56, channel region 55 and source and drain electrodes 61 and 62, and a p-n-p field effect transistor with gate electrodes 63 and 64, gate electrode zones 53 and 58, channel region 57 and source and drain electrodes 65 and 66.

The conductivity types indicated in the examples may in principle of course be replaced all of them by their opposite conductivity types. Furthermore, instead of one emitter zone the transistor described may also comprise several emitter zones.

Many variations are possible to those skilled in the art without departing from the scope of this invention. For example, other semiconductor materials or combinations of semiconductor materials may be used in which (see FIG. 2) the layer 3, for example, may be manufactured from a semiconductor material differing from that of the regions 1 and 2. The inset insulating pattern may project partly beyond the semiconductor surface and, if desirable, may consist fully or partly of materials other than silicon oxide. In addition to the elements described, other passive (resistors, capacitors) or active semiconductor circuit elements may also be present in the circuit. Furthermore, the transistors may be used in the reverse sense, in which, for example (see FIGS. 2) the buried layer 9 is used as an emitter zone and the zone 8 is used as a collector zone. In this case it may be advisable to cause the doping of the base zone 7 to decrease from the layer 9 towards the surface. The doping of the various regions may, apart from diffusion out of the atmosphere also be carried out fully or partly by ion implantation, preferably while using the inset insulating material as a mask, or by diffusion out of a doped oxide layer.

Finally it should be stressed that, although in the examples the portion (5B) of the sunken isolating pattern that brings about the division in a first and a second island-shaped region extends down to within the second buried layer (9), this is by no means necessary, and that this portion (5B) of the isolating pattern may well be so shallow as to not extend up to the second buried layer.

What is claimed is:

1. A semiconductor device comprising a semiconductor body having a lower region of a first conductivity type, a first epitaxial layer on said lower region, a second epitaxial layer on said first epitaxial layer and having an upper surface, a first buried layer of a second conductivity type present in the body and extending from said lower region up through the first epitaxial layer and having its maximum impurity concentration at the lower region - first layer interface, a second buried layer of said first conductivity type present in the body and extending between said first buried layer and into the second epitaxial layer and having its maximum impurity concentration at the first layer-second layer interface, a pattern of insulating material inset in the second layer, said inset insulating material pattern including a first portion substantially entirely surrounding a region of second layer and adjoining the first buried layer along is preipheral portions and having a second portion within the first portion and dividing the said second layer region into at least a first island region and a second island region enclosed laterally by the first insulating pattern portion and below by the first buried layer, said first and second island regions both adjoining the first buried layer, said second island region being of the first conductivity type, said second insulating pattern portion being spaced from the first buried layer by at least a part of the thickness of the second buried layer, and a first semiconductor circuit element built at least partly in the first island region.

2. A semiconductor device as claimed in claim 1 wherein the second buried layer also adjoins the first insulating layer portion and entirely separates the second layer region from the first buried layer.

3. A semiconductor device as claimed in claim 2 wherein the lower region of the first conductivity type comprises a highly doped substrate of the first conductivity type, and the first and second epitaxial layers are also of the first conductivity type.

4. A semiconductor device as claimed in claim 2 wherein the first island region comprises a zone of the second conductivity type which adjoins the surface.

5. A semiconductor device as claimed in claim 2 wherein a third buried layer of the second cconductivity type is present in the body beside the first buried layer and extending from the region of the first conductivity type into the first layer and having its maximum impurity concentration at the lower region - first layer interface, a third portion of the insulating layer pattern adjoining the third buried layer and surrounding a further part of the second layer and together with the third buried layer separating said further part of the second layer substantially entirely from the region of the first conductivity type and from the remaining part of the second layer, said further part comprising at least a third island region bounded by the third buried layer and the inset insulating layer pattern, and a second semiconductor circuit element having a structure which is complementary to the first circuit element being built at least partly in the third island region.

6. A semiconductor device as claimed in claim 5 wherein the further part of the second layer is divided by a fourth portion of the insulating material pattern which adjoins the third buried layer and extends at most over a part of the thickness of said third buried layer into a third island region in which the second semiconductor element is provided and a fourth island region of the second conductivity type.

* * * * *